US006583643B2

(12) United States Patent
Lin

(10) Patent No.: US 6,583,643 B2
(45) Date of Patent: Jun. 24, 2003

(54) TEST DEVICE FOR TESTING A LIQUID CRYSTAL DISPLAY (LCD) UNIT

(75) Inventor: Shao-ming Lin, Kaohsiung (TW)

(73) Assignee: Hannstar Display Corporation, Taipei (TW)

( * ) Notice: Subject to any disclaimer, the term of this patent is extended or adjusted under 35 U.S.C. 154(b) by 86 days.

(21) Appl. No.: 10/021,325

(22) Filed: Oct. 30, 2001

(65) Prior Publication Data

US 2002/0153921 A1 Oct. 24, 2002

(30) Foreign Application Priority Data

Apr. 19, 2001 (TW) ...................................... 90206181 U

(51) Int. Cl.$^7$ ................................................ G01R 31/00

(52) U.S. Cl. ..................................... 324/770; 324/158.1

(58) Field of Search ............................. 324/158.1, 770; 439/55, 260, 263, 267; 269/104, 203, 303, 304; 248/309.1, 346.01, 346.03, 346.06, 346.07

(56) References Cited

U.S. PATENT DOCUMENTS 4,976,629 A * 12/1990 Werner ....................... 439/259
6,150,833 A * 11/2000 Lin et al. .................... 324/770
6,450,469 B1 * 9/2002 Okuno ................. 248/346.01
6,486,927 B1 * 11/2002 Kim .............................. 349/1

* cited by examiner

*Primary Examiner*—Kamand Cuneo
*Assistant Examiner*—Russell M. Kobert
(74) *Attorney, Agent, or Firm*—J.C. Patents

(57) ABSTRACT

A test device suitable for testing a liquid crystal display (LCD) unit. The test device comprises a first supporting board and a plurality of first receptacles formed on one side of the first supporting board. A plurality of openings are arranged in such a way that interval spaces are in between the openings. A second supporting board is provided, wherein a plurality of second receptacles are formed on one side of the second supporting board. Two connecting boards are respectively connected to the first supporting boards and the second supporting boards. A plurality of adjustable partitions are located on the connecting boards, so that interval spaces between the first supporting board and the second supporting board can be adjusted. The test device further comprises a sole plate, a plurality of inverters and a plurality of conductive wires.

10 Claims, 3 Drawing Sheets

TEST DEVICE FOR TESTING A LIQUID CRYSTAL DISPLAY (LCD) UNIT

CROSS-REFERENCE TO RELATED APPLICATION

This application claims the priority benefit of Taiwan application serial no. 90206181, filed Apr. 19, 2001.

BACKGROUND OF THE INVENTION

1. Field of Invention

The present invention relates to a test device. More particularly, the present invention relates to a test device suitable for testing a liquid crystal display unit.

2. Description of the Related Art

Liquid crystal is a substance between crystal and liquid. When the liquid is excited by an electrical field or magnetic field, the arrangement of the atomic structure will change and result in different phonological properties.

With the development of liquid crystal display (LCD) devices, the LCD devices are utilized in various products. Therefore, the standard for the quality of the LCD devices is more demanding. Various tests are provided specifically for testing the reliability of the LCD devices, such as high temperature, high humidity and low temperature tests. However, the prior art does not have the necessary requirements for testing the reliability of the LCD devices.

FIGS. 1A and 1B illustrate schematic views of a conventional AGING test machine. Since the prior art does not have any suitable tool for testing the reliability of LCD devices, an AGING machine 100 has been utilized to testing the reliability of LCD devices. A burn-in test is provided by the AGING machine in a 50° C. environment, in which the LCD device is electrically connected for 6.5 hours. Referring to FIGS. 1A and 1B, metal pipes 102 are used for supporting and separating each LCD device (not shown). Conductive wires 104 use each inverter underneath the AGING machine (not shown) to electrically connect to the corresponding LCD devices located above the AGING machine.

However, the AGING machine provides the burn-in test to only a whole set of LCD devices. Therefore, there is no single switch of the AGING machine to control an open/close status of the switch of the inverters. Thus, if there are only a few LCD devices to test, the whole AGING machine has to be electrically opened to allow the inverters to burn off easily. Moreover, the AGING machine is not designed for testing the reliability of the LCD units; therefore, the test machine cannot be subjected to a high temperature, high humidity or low temperature environment for testing. The AGING machine cannot be moved easily to various conditions for conducting the environmental test on the LCD units. The AGING machine is also limited to certain test environment conditions; for example, it cannot be subjected to a temperature higher than 50° C. The metal pipes 102, which are used for supporting and separating the LCD units, are not adjustable. Thus the metal pipes 102 are limited to a LCD unit of a certain size.

SUMMARY OF THE INVENTION

To overcome the above-mentioned problems, the present invention provides a test device, suitable for testing a liquid crystal display (LCD) unit. The test device comprises a first supporting board and a plurality of first receptacles formed on one side of the first supporting board. A plurality of openings are formed on the first supporting board, wherein the openings are arranged in such a way that interval spaces are in between the openings. A second supporting board is provided, wherein a plurality of second receptacles are formed on one side of the second supporting board. Two connecting boards are respectively connected to the first supporting boards and the second supporting boards, wherein a back side of the of the first supporting board corresponds to a back side of the second supporting board and a distance is in between them. A plurality of adjustable partitions are located on the connecting boards, so that interval spaces between the first supporting board and the second supporting board can be adjusted. A sole plate is provided, wherein three sides of the sole plate are fixed to the first supporting board and the connecting boards. A plurality of inverters are connected to the sole plate and arranged in such a way that interval spaces are in between the inverters. A plurality of conductive wires are provided, wherein one end of the conductive wires is electrically connected to the inverters, and another end is connected to the openings of the first supporting board and to a connector, and wherein the connector is connected to the LCD unit.

The test device of the present invention further comprises a plurality of switches, which are installed on the first supporting board and are used to control an open/close status of the inverters. Two handles are installed on the connecting boards of the test device. Adjustable partitions of the connecting boards are rectangular shaped and are utilized to secure the first supporting board and the second supporting board. The adjustable partitions can be adjusted according to various sizes of the LCD units.

According to the characteristics of the present invention, LCD units of various sizes can be used due to the adjustable partitions; thus, the test device of the present invention is not limited to a LCD unit of a certain size. The present invention utilizes the sole plate to connect the inverters and the related wires underneath it in order to avoid having a disorganized circuit. The present invention utilizes the switches of the inverters based on the one to one characteristic, i.e., one single inverter can control the open/close status of the switch of the LCD units. Therefore, when one of the receptacles is not connected to the inverters, the LCD units can be switched off to prevent the device from overheating. The handles of the test device of the present invention allow the test device to be transported easily, and the test can be conducted in different environments without a transportation problem.

Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
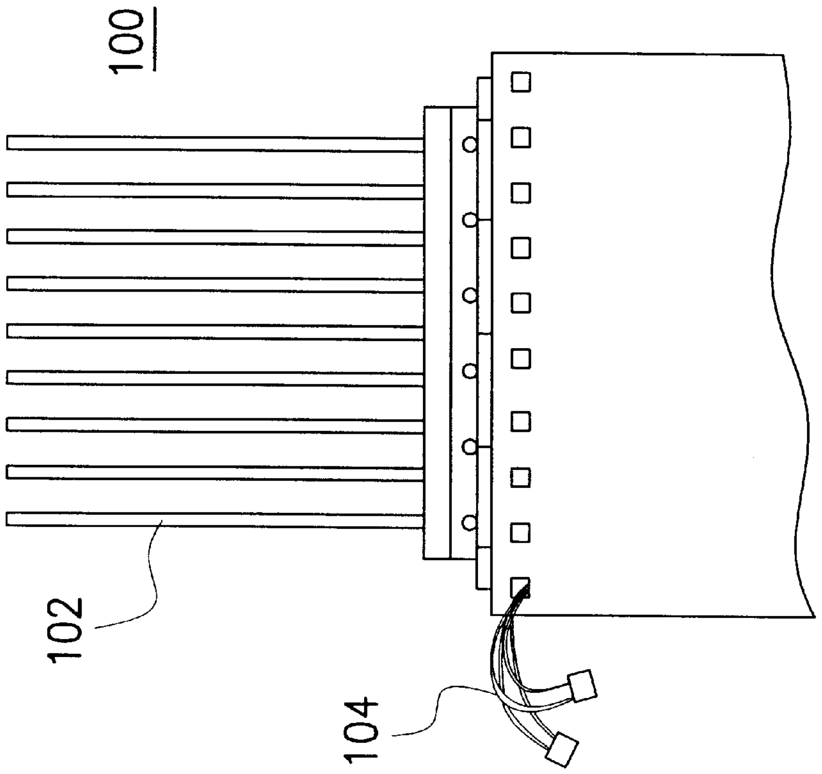
FIG. 1A(PRIOR ART)
FIG. 1A is a schematic view of a conventional AGING test machine.
Figure 1B:
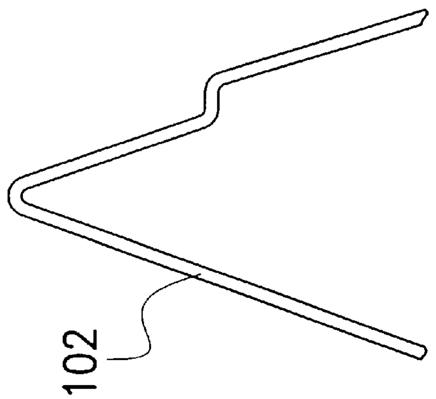
FIG. 1B(PRIOR ART)
FIG. 1B is a schematic cross-sectional view of a portion of FIG. 1A.
Figure 2:
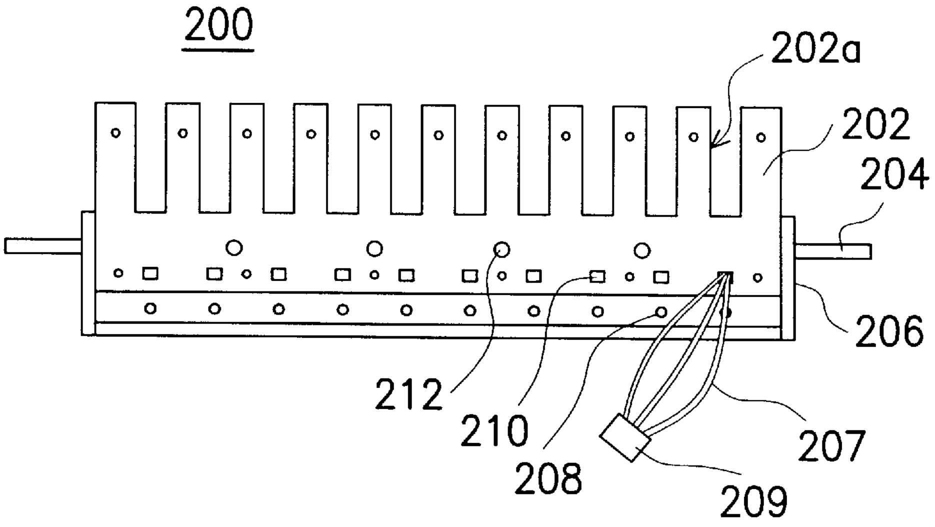
FIG. 2 is a test device for testing liquid crystal display (LCD) units in accordance with a preferred embodiment of the present invention.
Figure 3:
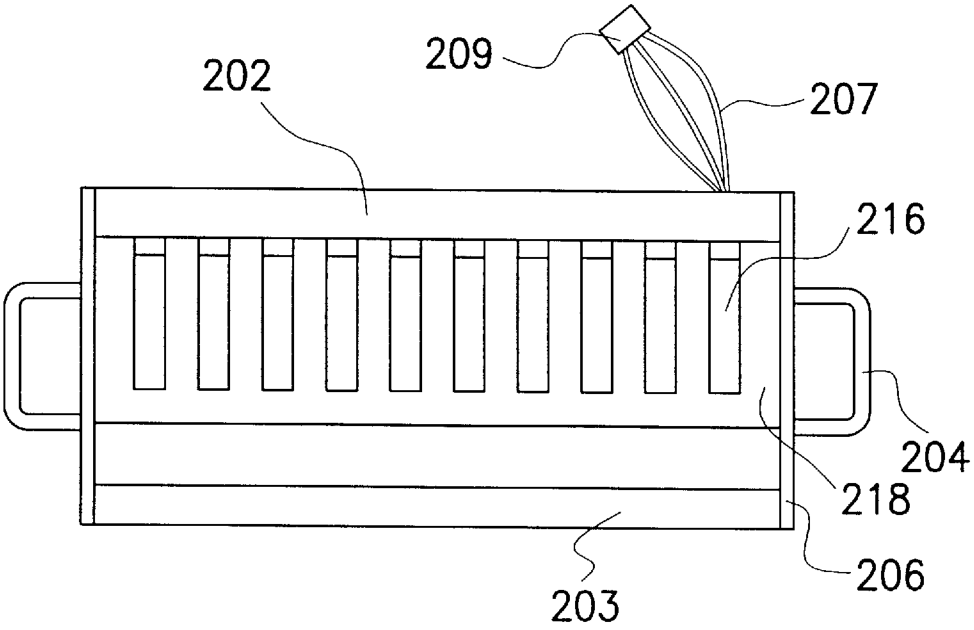
FIG. 3 is a bottom view of FIG. 2
Figure 4:
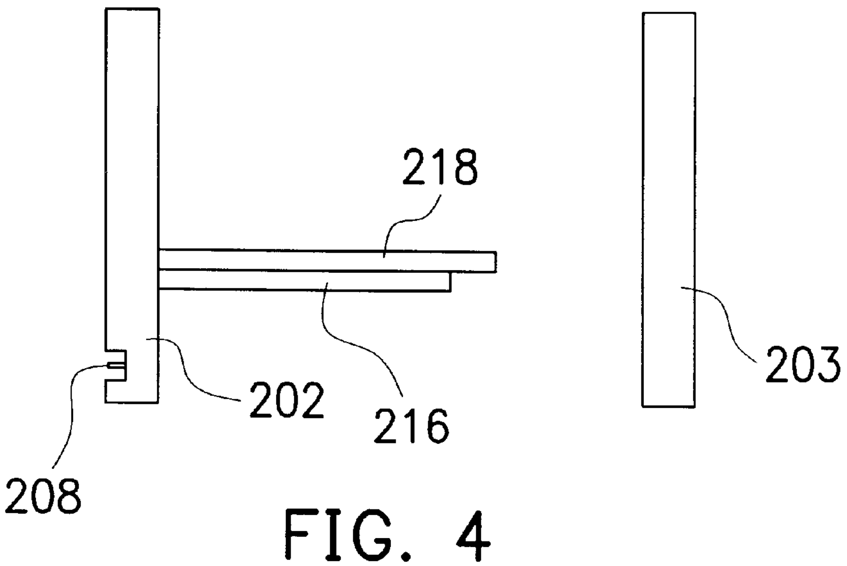
FIG. 4 is a schematic cross-sectional view of FIG. 2.

Referring to FIGS. 2–4, FIG. 2 illustrates a test device for testing liquid crystal display (LCD) units in accordance with a preferred embodiment of the present invention. FIG. 3 is a bottom view of FIG. 2, and FIG. 4 is a schematic cross-sectional view of FIG. 2. The test device 200, which is suitable for testing LCD units, comprises: a first supporting board 202, a second supporting board 203, two connecting boards 206, a sole plate 218, a plurality of inverters 216, a plurality of conductive wires 207 and a plurality of connectors 209.

A plurality of first receptacles 202*a* are formed on one side of the first supporting board 202, and a plurality of openings 210 are formed on the first supporting board. The openings 210 are located and arranged in a way such that interval spaces are in between the openings 210. A plurality of second receptacles (not shown) are formed on one side of the second supporting board 203. A size of the first receptacles 202*a* is the same as a size of the second receptacles, and positions of the first receptacles 202*a* correspond to the second receptacles. The first 202*a* and second receptacles of the test device 200 are designed in a way such that they have the same size and corresponding positions, so that LCD units (not shown) can be located in this test device 200 for a reliability test.

The connecting boards 206 are connected respectively to the first supporting board 202 and the second supporting board 203. There is a predetermined distance between the first supporting board 202 and the second supporting board 203. Three sides of the sole plate 218 are respectively fixed to the first supporting board 202 and the connecting boards 206. A method of fixing the three sides of the sole plate 218 to the first supporting board 202 and the connecting boards 206 is to utilize a plurality of screws 212. The inverters 216 are fixed underneath a bottom side of the sole plate 218, in which all related connections are fixed to the bottom side of the sole plate 218. Thus, an upper side of the sole plate 218 is clear, and messy connections during a test can be avoided.

One end of the conductive wires 207 are electrically connected to the inverters 216, and another end of the conductive wires 207 are connected respectively to the opening 210 of the first supporting boards 202 and are connected to the connectors 209. The connectors 209 are electrically connected to the LCD units (not shown) during the reliability test.

The present invention utilizes a method of installing a plurality of switches 208 on the first supporting board 202 in order to respectively control the open/close of the inverters 216. A method of utilizing a switch 208 to correspond an inverter 216 can be used to control the open/close of a single LCD unit. The present invention installs handles 204 respectively on both sides of the supporting boards 206 in accordance with the transporting requirements of various environmental tests.

Figure 5:
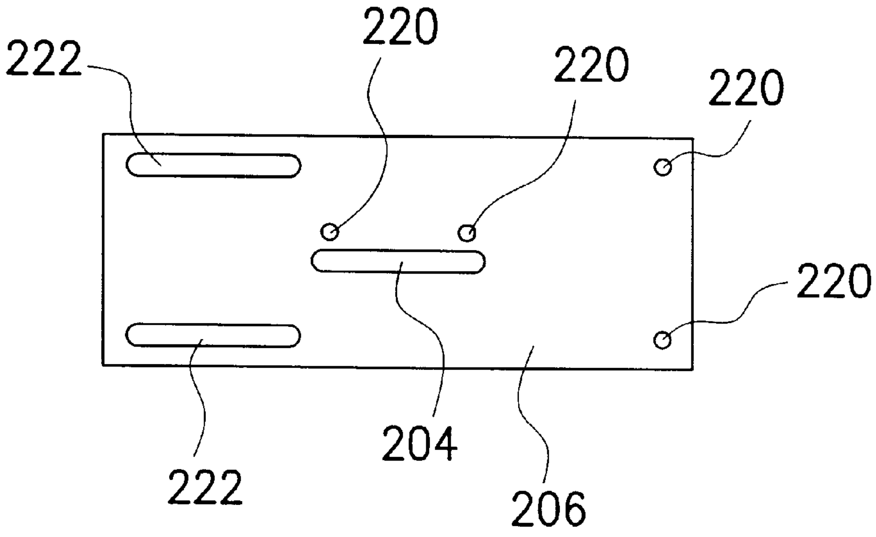
FIG. 5 is a schematic view of a connecting board in accordance with a preferred embodiment of the present invention.

FIG. 5 illustrates a schematic view of a connecting board in accordance with a preferred embodiment of the present invention. A plurality of adjustable partitions 222 are located on the connecting boards 206. The adjustable partitions 222 are rectangular shaped. Before the first supporting boards 202 and the second supporting boards 203 are fixed, the adjustable partitions 222 are utilized to adjust the interval space between the first supporting boards 202 and the second supporting boards 203. Therefore, the test device 200 of the present invention can be used for LCD units of various sizes. The connecting boards 206 can be fixed to the first supporting boards 202 and the second supporting boards 203 can be fixed to the sole plate 218 by screws 220, for example.

From the above-mentioned embodiment, the present invention has the following advantages:

1. The adjustable partitions have been designed in such way that the interval space between the first supporting boards 202 and the second supporting boards 203 can be adjusted in accordance with the size of the LCD units.
2. The present invention utilizes the sole plate to connect the inverters and the related wires underneath its bottom side in order to avoid a disorganized circuit.
3. The present invention utilizes the switches of the inverters based on the one to one characteristic, i.e., one single inverter can control the open/close status of the LCD units. Therefore, when one of the receptacles is not connected to the inverters, the LCD units can be switched off to prevent the device from overheating.
4. The present invention installs handles respectively on both sides of the supporting boards, so that various environmental tests can be performed on the LCD units to test for reliability.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A test device for testing a liquid crystal display (LCD) unit, the test device comprises:

a first supporting board, wherein said first supporting board has a plurality of first receptacles, the first receptacles being formed on one side of the said first supporting board, said first supporting board having a plurality of openings, wherein the openings are arranged in such a way that interval spaces are in between the openings;

a second supporting board, wherein said second supporting board has a plurality of second receptacles, the second receptacles being formed on one side of the second supporting board;

two connecting boards, respectively connected to the said first supporting boards and the said second supporting boards, wherein a back side of the first supporting boards is corresponding to a back side of the second supporting boards and there is a distance in between them, a plurality of adjustable partitions are located on the connecting boards, so that interval spaces between the first supporting board and the second supporting board can be adjusted;

a sole plate, three sides of the sole plate are fixed to the first supporting board and the connecting boards;

a plurality of inverters, connected to the sole plate and arranged in a way that interval spaces are in between the inverters; and a plurality of conductive wires, one end of the conductive wires is electrical connected to the inverters, another end is connected to the openings of the first supporting board and to a connector, wherein the connector is connected to the LCD unit.

2. The test device of claim 1, wherein the test device further comprises a plurality of switches installed on the first supporting board and control an open/close status of the switches of the inverters.

3. The test device of claim 1, wherein the test device further comprises two handles that are installed on the connecting boards.

4. The test device of claim 1, wherein said adjustable partitions of the connecting boards are rectangle shaped, and are utilized to secure the first supporting board and the second supporting board, wherein the adjustable partitions can be adjusted according to various sizes of the LCD units.

5. The test device of claim 1, wherein a size of the first receptacles is the same as a size of the second receptacles, and locations of the first receptacles are corresponded to locations of second receptacles.

6. The test device of claim 1, wherein the sole plate has a surface which is utilized for connecting to the inverters.

7. The test device of claim 4, wherein the said test device further comprises a plurality of switches installed on the first supporting board and are used to control an open/close statue of the switches of the inverters.

8. The test device of claim 4, wherein the said test device further comprises two handles fixed on the connecting boards.

9. The test device of claim 4, wherein a size of the first receptacles is the same as a size of the second receptacles, and locations of the first receptacles are corresponded to locations of second receptacles.

10. The test device of claim 4, wherein the sole plate has a surface which is utilized for connecting to the inverters.

* * * * *